US012761560B2

(12) United States Patent
Park et al.

(10) Patent No.: US 12,761,560 B2
(45) Date of Patent: Oct. 13, 2026

(54) POLYMERS FOR PHOTORESIST AND PHOTORESIST COMPOSITIONS INCLUDING THE SAME

(71) Applicant: Samsung Electronics Co., Ltd., Suwon-si (KR)

(72) Inventors: Juhyeon Park, Hwaseong-si (KR); Hyunwoo Kim, Seongnam-si (KR); Suk Koo Hong, Suwon-si (KR); Su Min Kim, Suwon-si (KR); Yechan Kim, Hwaseong-si (KR); Jicheol Park, Anyang-si (KR); Honggu Im, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 858 days.

(21) Appl. No.: 17/826,234

(22) Filed: May 27, 2022

(65) Prior Publication Data

US 2023/0123035 A1 Apr. 20, 2023

(30) Foreign Application Priority Data

Oct. 14, 2021 (KR) ........................ 10-2021-0136379

(51) Int. Cl.

*G03F 7/039* (2006.01)
*C08F 214/18* (2006.01)

(Continued)

(52) U.S. Cl.

CPC .......... *G03F 7/0397* (2013.01); *C08F 214/18* (2013.01); *C08F 220/1806* (2020.02);

(Continued)

(58) Field of Classification Search

CPC ..... G03F 7/0397; C08F 226/02; C08F 228/02
See application file for complete search history.

(56) References Cited

U.S. PATENT DOCUMENTS 9,034,558 B2 * 5/2015 Yamaguchi ............... G03F 7/11 430/326
9,201,300 B2 * 12/2015 Hatakeyama ........... G03F 7/004

(Continued)

FOREIGN PATENT DOCUMENTS

JP 58170746 A * 10/1983
JP 2003241382 A 8/2003

(Continued)

OTHER PUBLICATIONS

English translation of JP2013045055. (Year: 2013).*
English translation of JP2012133053. (Year: 2012).*
English translation of JP58170746. (Year: 1983).*

*Primary Examiner* — Mark F. Huff
*Assistant Examiner* — Anna Malloy
(74) *Attorney, Agent, or Firm* — Wolf, Greenfield & Sacks, P.C.

(57) ABSTRACT

A polymer for photoresist and a photoresist composition including the polymer. The polymer for photoresist may (Continued)

include a polymerization unit comprising a sensitizer, and a protection group. The polymerization unit may include a structure of chemical formula 1:

[Chemical formula 1]

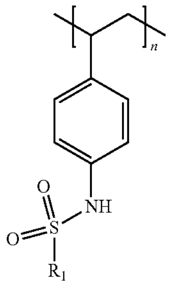

wherein R1 is hydrogen, a halogen element, a methyl group, a trifluoromethyl group, a substituted or unsubstituted alkyl group having 1 to 10 carbon atoms, a substituted or unsubstituted aryl group having 6 to 18 carbon atoms, or a substituted or unsubstituted arylalkyl group having 6 to 18 carbon atoms, and n is an integer of 1 to 100,000.

16 Claims, 5 Drawing Sheets

(51) Int. Cl.
*C08F 220/18* (2006.01)
*C08F 220/30* (2006.01)
*C08F 226/02* (2006.01)
*C08F 228/02* (2006.01)
*G03F 7/004* (2006.01)

(52) U.S. Cl.
CPC ........ *C08F 220/301* (2020.02); *C08F 226/02* (2013.01); *C08F 228/02* (2013.01); *G03F 7/0045* (2013.01)

(56) References Cited

U.S. PATENT DOCUMENTS

| | | | | |
|---|---|---|---|---|
| 10,025,181 | B2 | 7/2018 | Kramer | |
| 10,495,968 | B2 | 12/2019 | Aqad et al. | |
| 2010/0310987 | A1* | 12/2010 | Maruyama | C09D 125/18 526/280 |
| 2015/0086929 | A1* | 3/2015 | Hatakeyama | G03F 7/325 524/378 |
| 2016/0145205 | A1* | 5/2016 | Sakamoto | C08F 220/1812 560/151 |
| 2019/0361347 | A1 | 11/2019 | Domon et al. | |
| 2021/0011380 | A1* | 1/2021 | Nihashi | G03F 7/0397 |

FOREIGN PATENT DOCUMENTS

| | | | | | |
|---|---|---|---|---|---|
| JP | 2012133053 | A | * | 7/2012 | |
| JP | 2013045055 | A | * | 3/2013 | |
| WO | 2017169626 | A1 | | 1/2019 | |
| WO | WO-2019187881 | A1 | * | 10/2019 | G03F 7/0045 |

* cited by examiner

POLYMERS FOR PHOTORESIST AND PHOTORESIST COMPOSITIONS INCLUDING THE SAME

CROSS-REFERENCE TO RELATED APPLICATION

This application claims priority to Korean Patent Application No. 10-2021-0136379 filed on Oct. 14, 2021, in the Korean Intellectual Property Office, and all the benefits accruing therefrom under 35 U.S.C. 119, the contents of which in its entirety are herein incorporated by reference.

BACKGROUND

The present disclosure relates to a polymer for photoresist and a photoresist composition including the same, and specifically, to a polymer for extreme ultraviolet photoresist and a photoresist composition including the same.

A photolithography process using a photoresist composition is utilized for forming various patterns included in a semiconductor device. For example, the photoresist film may be divided into an exposed portion and a non-exposed portion through an exposure process, and the exposed portion or the non-exposed portion may be removed through a developing process to form a photoresist pattern. Next, a desired pattern may be formed by patterning an etching target film using the photoresist pattern as an etching mask.

As the design rules of semiconductor devices are gradually reduced, techniques for forming a pattern of a smaller size have been developed. For example, an extreme ultraviolet lithography process that utilizes extreme ultraviolet (EUV) having a short wavelength as light has been used. In particular, in a mass production process of nano-class semiconductor devices of 40 nm or less, extreme ultraviolet having a wavelength of about 10 nm to about 14 nm may be used.

SUMMARY

Aspects of the present disclosure provide photoresist polymers that improve a reaction efficiency of an exposure process.

Aspects of the present disclosure also provide photoresist compositions that improve a reaction efficiency of the exposure process.

However, aspects of the present disclosure are not limited to the one set forth herein. The above and other aspects of the present disclosure will become more apparent to one of ordinary skill in the art to which the present disclosure pertains by referencing the detailed description of the present disclosure given below.

According to some embodiments of the present invention, there is provided a polymer for photoresist comprising, a first polymerization unit comprising a sensitizer group, and a second polymerization unit comprising a protection group, wherein the first polymerization unit comprises a structure of chemical formula 1:

[Chemical formula 1]

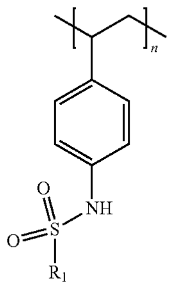

wherein $R_1$ is hydrogen, a halogen element, a methyl group, a trifluoromethyl group, a substituted or unsubstituted alkyl group having 1 to 10 carbon atoms, a substituted or unsubstituted aryl group having 6 to 18 carbon atoms, or a substituted or unsubstituted arylalkyl group having 6 to 18 carbon atoms, and n is an integer of 1 to 100,000.

According to some embodiments of the present invention, there is provided a photoresist composition comprising, a polymer including a first polymerization unit that comprises a sensitizer group, and a photoacid generator, wherein the first polymerization unit comprises a structure of chemical formula 1:

[Chemical formula 1]

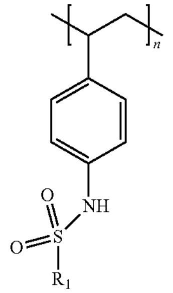

wherein $R_1$ is hydrogen, a halogen element, a methyl group, a trifluoromethyl group, a substituted or unsubstituted alkyl group having 1 to 10 carbon atoms, a substituted or unsubstituted aryl group having 6 to 18 carbon atoms, or a substituted or unsubstituted arylalkyl group having 6 to 18 carbon atoms, and n is an integer of 1 to 100,000.

According to some embodiments of the present invention, there is provided a photoresist composition comprising, a polymer including a sensitizer group and a protection group, a photoacid generator, and a quencher, wherein a first polymerization unit having a structure of chemical formula 1 comprises the sensitizer group, and a second polymerization unit having a structure of chemical formula 2 comprises the protection group:

[Chemical formula 1]

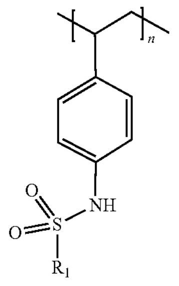

wherein $R_1$ is hydrogen, a halogen element, a methyl group, a trifluoromethyl group, a substituted or unsubstituted alkyl group having 1 to 10 carbon atoms, a substituted or unsubstituted aryl group having 6 to 18 carbon atoms, or a substituted or unsubstituted arylalkyl group having 6 to 18 carbon atoms, and n is an integer of 1 to 100,000,

[Chemical formula 2]

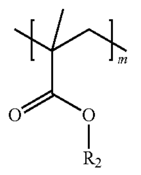

wherein $R_2$ is a substituted or unsubstituted alkyl group having 4 to 15 carbon atoms, or an aromatic ring compound, and m is an integer of 1 to 100,000, and n:m is 3:7 to 5:5.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Figure 1A:
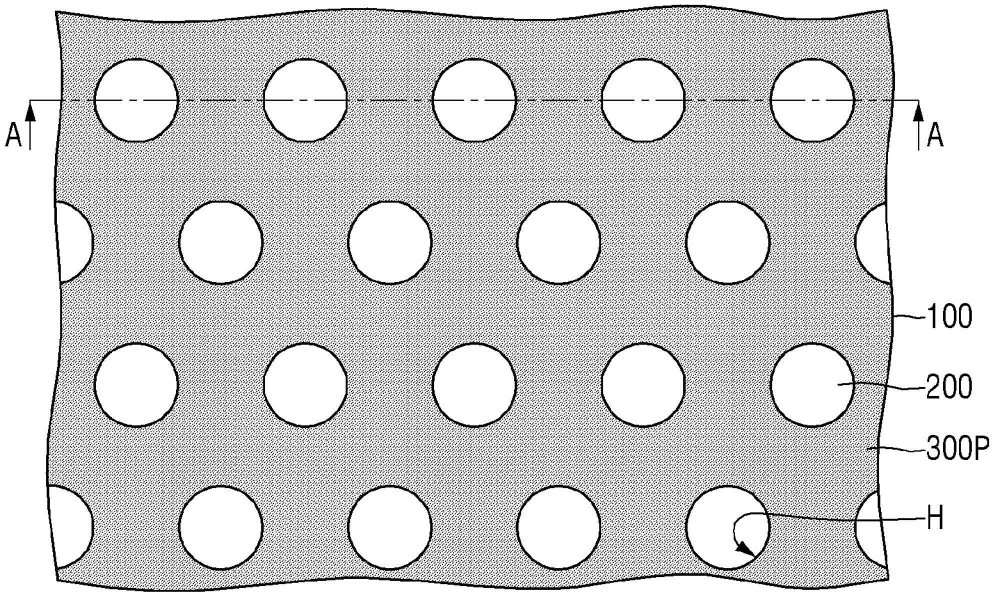
FIGS. 1A and 1B are plan views showing a photoresist pattern according to some embodiments.

As used herein, the term "substituted or unsubstituted" may mean substitution or non-substitution with one or more substituents selected from a group consisting of a hydrogen atom, a heavy hydrogen atom, a halogen atom, an alkyl group, a hydroxy group, an alkoxy group, an ether group, an acetal group, an alkyl halide group, a alkoxy halide group, an ether halide group, an alkenyl group, a thio group, a sulfinyl group, a sulfonyl group, a carbonyl group, a phosphine oxide group, a phosphine sulfide group, an aryl group, a hydrocarbon ring group, and a hetero ring group. Moreover, each of the exemplified substituents may be substituted or unsubstituted. For example, the alkyl halide group may be interpreted as an alkyl group. An alkylsulfonate group, an alkylthio group, an alkylsulfoxy group, an alkylcarbonyl group, an alkylester group, an alkylether group, and an alkylacetal group may be interpreted as each of a sulfonate group, a thio group, a sulfoxy group, a carbonyl group, an ester group, an ether group, and an acetal group, respectively.

As used herein, unless otherwise specified, the carbonyl group may be a substituted or unsubstituted carbonyl group. The ester group may be a substituted or unsubstituted ester group. The acetal group may be a substituted or unsubstituted acetal group.

As used herein, the expression "bonded to adjacent groups to form a ring" may mean bonding to adjacent groups to form a substituted or unsubstituted hydrocarbon ring or a substituted or unsubstituted heterocycle. The hydrocarbon ring includes an aliphatic hydrocarbon ring and an aromatic hydrocarbon ring. The heterocycle includes an aliphatic heterocycle and an aromatic heterocycle. The hydrocarbon ring and the heterocycle may be monocycle or polycycle. Further, the rings formed by binding to each other may be linked to other rings to form a spiro structure.

As used herein, the alkyl group may be a linear alkyl group, a branched alkyl group, or a cyclic alkyl group. The alkyl group may include a primary alkyl, secondary alkyl, and tertiary alkyl. The number of carbon atoms of the alkyl group is not particularly limited, but, in some embodiments, an alkyl group having 1 to 7 carbon atoms, or more specifically, an alkyl group having 1 to 5 carbon atoms, may be used.

In the present specification, the alkyl groups of the alkyl sulfonate group, the alkyl thio group, the alkyl sulfoxy group, the alkyl carbonyl group, the alkyl ester group, the alkyl ether group, and the alkyl acetal group may be the same as those of the above-mentioned examples of the alkyl groups. As used herein, halogen elements may include fluorine, chlorine, iodine, and/or bromine. As used herein the term "and/or" includes any and all combinations of one or more of the associated listed items.

Unless otherwise defined in a chemical formula in the present specification, when a chemical bond is not drawn at a position where a chemical bond should be drawn, it may mean that hydrogen atom is bonded to that position.

As used herein, the same reference number may refer to the same component throughout the specification.

Hereinafter, polymers for photoresist according to some embodiments of the present invention and photoresist compositions including the same will be described.

In some embodiments, the photoresist composition may be used for formation of pattern formation or fabrication of an integrated circuit device (e.g., a semiconductor device). For example, the photoresist composition may be used in a patterning process for fabricating the integrated circuit device. The photoresist composition may be an extreme ultraviolet (EUV) photoresist composition. Extreme ultraviolet may mean ultraviolet having a wavelength of 13.0 nm to 13.9 nm, and in some embodiments, a wavelength of 13.4 nm to 13.6 nm. The extreme ultraviolet may mean light having an energy of 90 eV to 95 eV. As another example, the photoresist composition may be used in an exposure process that uses argon fluoride (hereinafter, ArF) as a light source. The light source that uses argon fluoride may release light having a wavelength of 185 nm to 200 nm, and in some embodiments, 190 nm to 195 nm. The photoresist composition may be a chemically amplified (chemically amplified resist type, CAR type) photoresist composition.

In some embodiments, the photoresist composition may include a polymer, a photoacid generator, and a quencher.

The polymer may include a sensitizer and a protection group. As used herein, "sensitizer" may also be referred to as "sensitizer group."

The sensitizer group may be present in a first polymerization unit represented by the following chemical formula 1. The sensitizer group may not react with acid or base. When the sensitizer group is irradiated with light, the sensitizer group releases electrons and hydrogen ions ($H^+$). When the sensitizer group is not irradiated with light, the sensitizer group does not release hydrogen ions ($H^+$).

[Chemical formula 1]

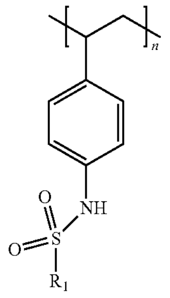

In chemical formula (1), $R_1$ is hydrogen, a halogen element, a methyl group, a trifluoromethyl group, a substituted or unsubstituted alkyl group having 1 to 10 carbon atoms, a substituted or unsubstituted aryl group having 6 to 18 carbon atoms, or a substituted or unsubstituted arylalkyl group having 6 to 18 carbon atoms, and n is an integer of 1 to 100,000.

In some embodiments, the first polymerization unit including sensitizer may be formed with a monomer represented by the following chemical formula 1-1.

[Chemical formula 1-1]

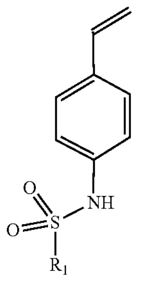

In chemical formula 1-1, $R_1$ is hydrogen, a halogen element, a methyl group, a trifluoromethyl group, a substituted or unsubstituted alkyl group having 1 to 10 carbon atoms, a substituted or unsubstituted aryl group having 6 to 18 carbon atoms, or a substituted or unsubstituted arylalkyl group having 6 to 18 carbon atoms.

In some embodiments, because the monomer including the sensitizer has an aminostyrene structure, the sensitizer may not react with an acid or base. When an acid or base is added to the emulsion, no reaction occurs. However, when irradiated with light, the sensitizer may release electrons and hydrogen ions ($H^+$).

In some embodiments, the monomer including the sensitizer group may include at least one of the substances represented by the following chemical formulas 1-2a to 1-2e. In some embodiments, the monomer(s) including the sensitizer may include one of twelve compounds listed under chemical formula 1-2c and/or one of twelve compounds listed under chemical formula 1-2e. For example, the monomers including the sensitizer may be two of twelve compounds listed under chemical formula 1-2e, or the monomer including the sensitizer may be one of twelve compounds listed under chemical formula 1-2e. As used herein, the term "substance" may be interchangeable with "compound" or "composition."

[Chemical formula 1-2a]

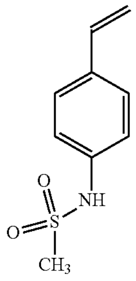

[Chemical formula 1-2b]

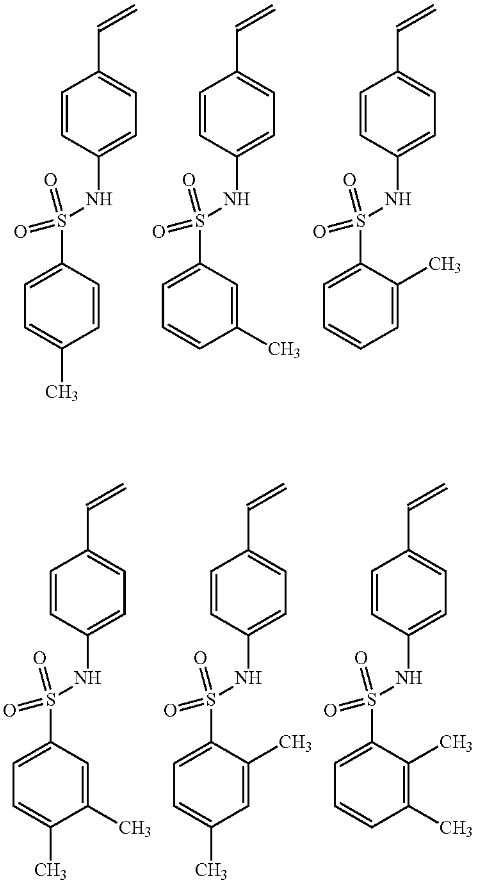

-continued
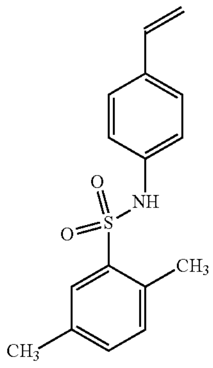
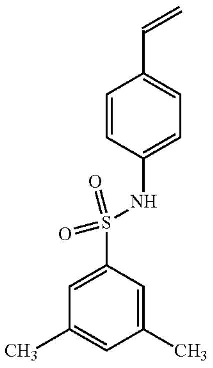
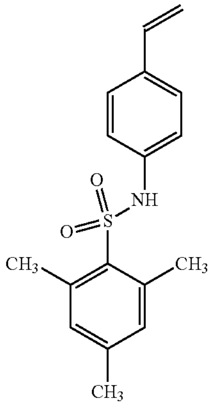
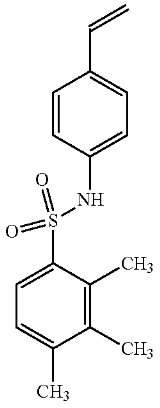
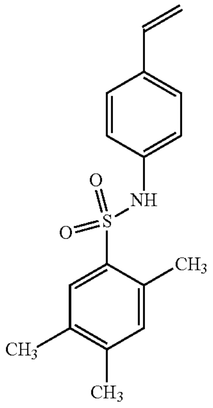
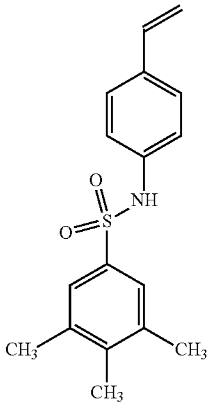
[Chemical formula 1-2c]
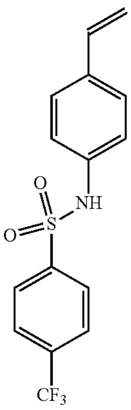
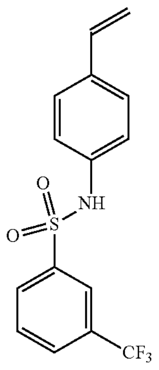
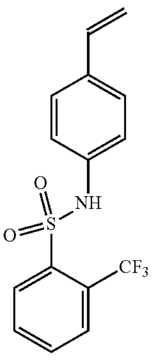
-continued
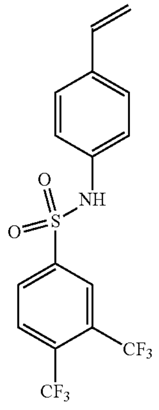
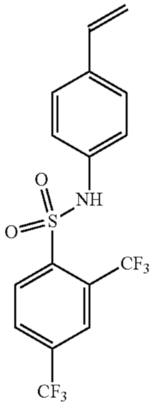
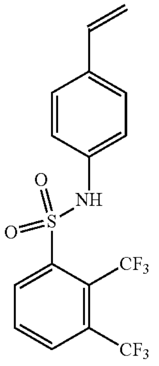
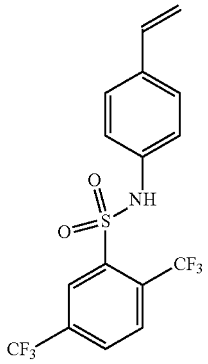
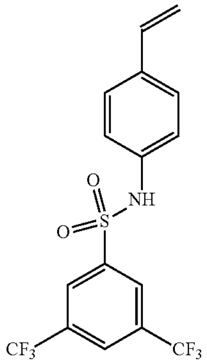
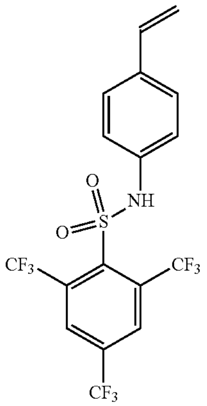
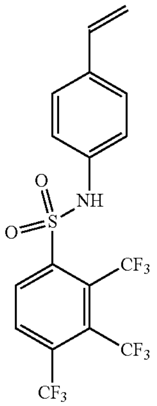
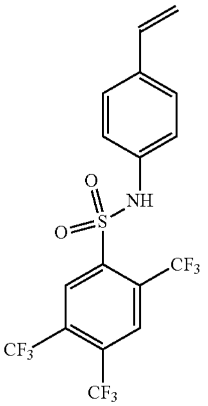
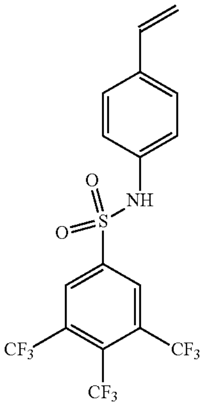

-continued
[Chemical formula 1-2d]
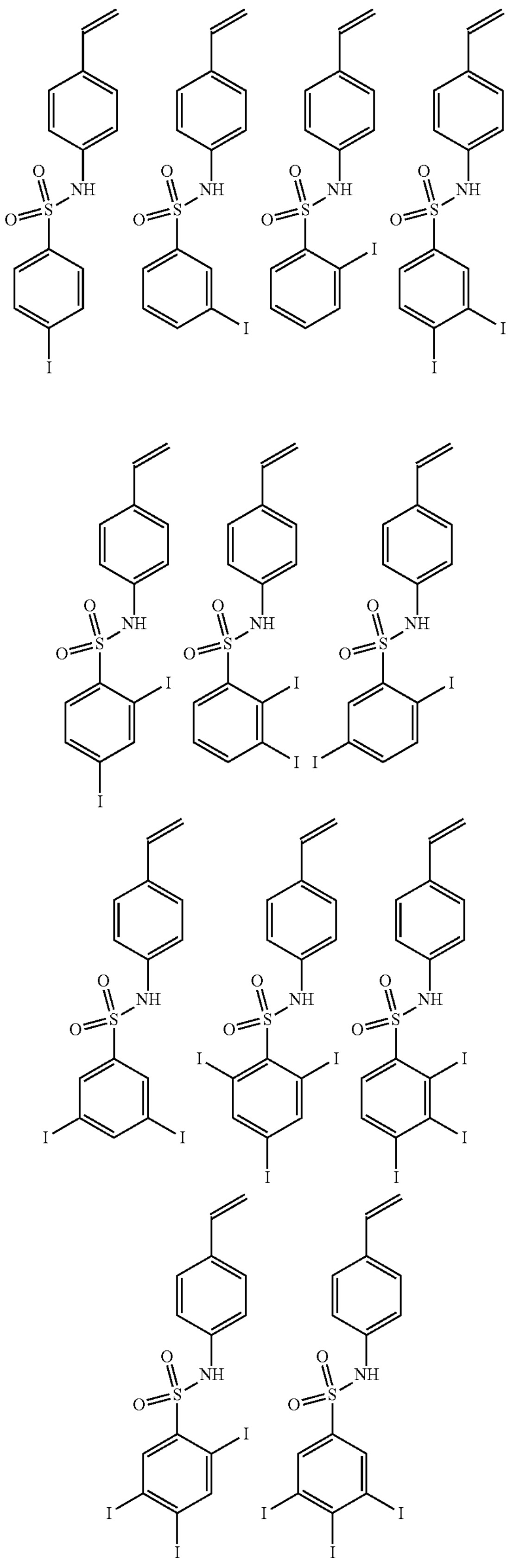
-continued
[Chemical formula 1-2e]
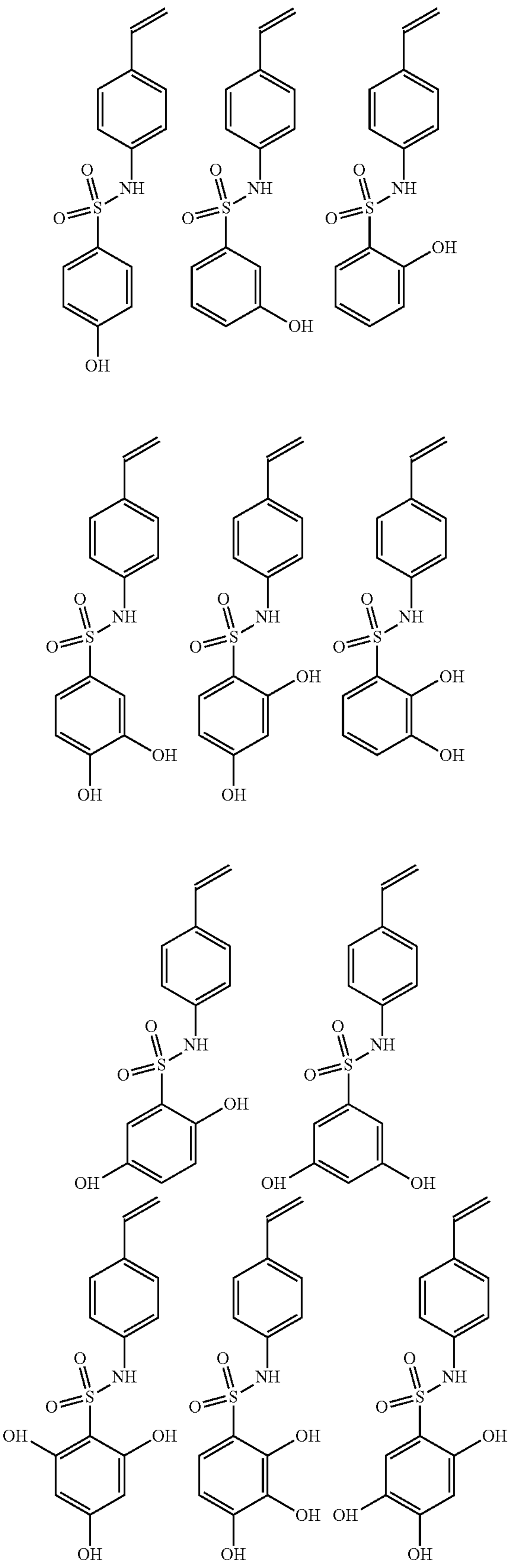

-continued

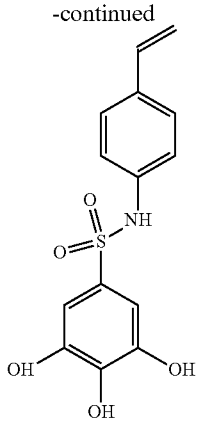

More preferably, the monomer including the sensitizer may include at least one of the substances (i.e., twelve compounds) represented by the chemical formula 1-2e.

In the chemical formula 1-2e, the monomer including the sensitizer further includes a hydroxyl group. Since the hydroxyl group further includes hydrogen atom, when the sensitizer is irradiated with light, the sensitizer may further release electrons and hydrogen ions ($H^+$). Therefore, the solubility of the photoresist composition may be increased and better exposure process efficiency may be obtained.

The protection group may be present in a second polymerization unit represented by the following chemical formula 2. The protection group may react with acid or base.

[Chemical formula 2]

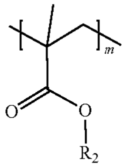

In chemical formula 2, $R_2$ may be a functional group that can be deprotected by an acid. For example, $R_2$ is a substituted or unsubstituted alkyl group having 4 to 15 carbon atoms, or an aromatic ring compound, and m is an integer of 1 to 100,000.

In some embodiments, the polymerization unit including the protection group may be formed with a monomer having a structure of chemical formula 2-1.

[Chemical formula 2-1]

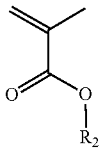

In chemical formula 2-1, $R_2$ may be a functional group that can be deprotected by an acid. For example, $R_2$ is a substituted or unsubstituted alkyl group having 4 to 15 carbon atoms, or an aromatic ring compound.

In some embodiments, the monomer including the protection group may include at least one of the substances represented by the following chemical formulas 2-2a to 2-2e.

[Chemical formula 2-2a]

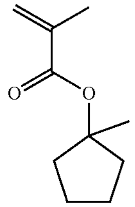

[Chemical formula 2-2b]

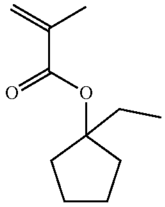

[Chemical formula 2-2c]

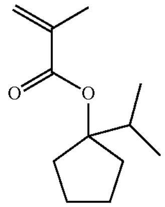

[Chemical formula 2-2d]

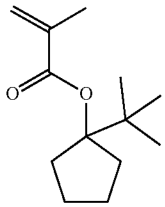

[Chemical formula 2-2e]

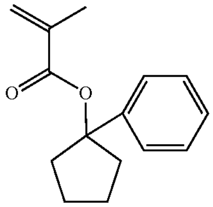

In some embodiments, the monomer including the protection group may include at least one of the substances represented by the following chemical formulas 2-3a to 2-3e.

[Chemical formula 2-3a]

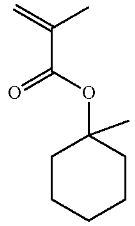

-continued

[Chemical formula 2-3b]

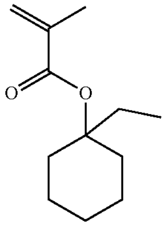

[Chemical formula 2-3c]

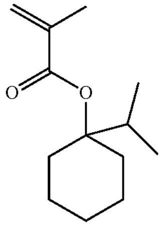

[Chemical formula 2-3d]

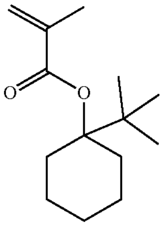

[Chemical formula 2-3e]

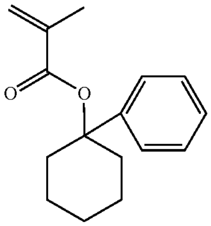

The first polymerization unit and the second polymerization unit may be linked with each other. When the first polymerization unit and the second polymerization unit are linked with each other, the ratio of n to m may be, for example, 3:7 to 5:5. Preferably, the ratio of n to m may be 4:6. However, the present invention is not limited thereto.

In some embodiments, the polymerization unit including a sensitizer group may further include at least one of a substance represented by chemical Formula 3 below and a substance represented by chemical formula 4 below. That is, the polymerization unit including a sensitizer group may include at least one or more of the substances represented by the chemical formula 1, the substance represented by the chemical formula 3, and the substance represented by the chemical formula 4.

[Chemical formula 3]

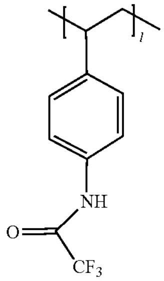

In the chemical formula 3, l is an integer of 1 to 100,000.

[Chemical formula 4]

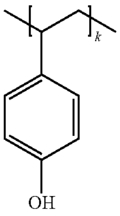

In the chemical formula 4, k is an integer of 1 to 100,000.

In some embodiments, a photoacid generator may generate hydrogen ions ($H^+$) in the exposure process of the photoresist film. The photoacid generator may include a substance represented by the following chemical formula 5 and/or a substance represented by chemical formula 6.

[Chemical formula 5]

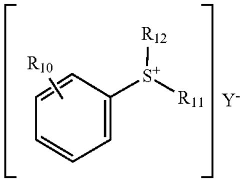

In chemical formula 5, $R_{10}$ is hydrogen, a halogen element, a methyl group, a trifluoromethyl group, or a substituted or unsubstituted alkyl group having 1 to 5 carbon atoms, $R_{11}$ and $R_{12}$ may be independently an alkyl group having 1 to 7 carbon atoms or a substituted or unsubstituted aromatic ring compound having 4 to 20 carbon atoms, and Y may be a conjugate base of a strong acid (e.g., a sulfonic acid).

[Chemical formula 6]

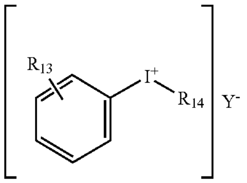

In chemical formula 6, $R_{13}$ is hydrogen, a halogen element, a methyl group, a trifluoromethyl group, or a substituted or unsubstituted alkyl group having 1 to 5 carbon atoms, $R_{14}$ is an alkyl group having 1 to 7 carbon atoms or a substituted or unsubstituted aromatic ring compound having 4 to 20 carbon atoms, and Y may be a conjugate base of a strong acid (e.g., a sulfonic acid). In some embodiments, the photoacid generator may include both a compound having a structure of chemical formula 5 and a compound having a structure of chemical formula 6, wherein Y of chemical formula 5 may be the same as or different from Y of chemical formula 6.

In some embodiments, the substance represented by chemical formula 5 may include a substance represented by chemical formula 5A below.

[Chemical formula 5A]

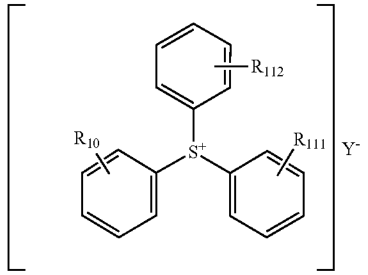

In chemical formula 5A, $R_{10}$, $R_{111}$ and $R_{112}$ are independently hydrogen, halogen element, a methyl group, a trifluoromethyl group, or a substituted or unsubstituted alkyl group having 1 to 5 carbon atoms, and Y is as defined in chemical formula 5.

In some embodiments, the substance represented by chemical formula 6 may include a substance represented by chemical formula 6A below.

[Chemical formula 6A]

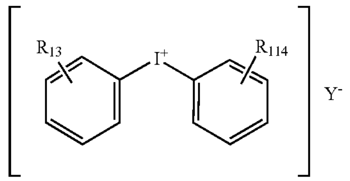

In chemical formula 6A, $R_{13}$ and $R_{114}$ are independently hydrogen, a halogen element, a methyl group, a trifluoromethyl group, or a substituted or unsubstituted alkyl group having 1 to 5 carbon atoms, and Y is as defined in chemical formula 6.

In some embodiments, in chemical formulas 5 and 6, Y may include a sulfonate group having 1 to 20 carbon atoms. For example, in the chemical formulas 5 and 6, Y may include a substance represented by the following chemical formula Y.

[Chemical formula Y]

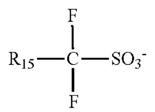

In chemical formula Y, $R_{15}$ may be hydrogen, a halogen element, or a substituted or unsubstituted alkyl group having 1 to 20 carbon atoms, or a substituted or unsubstituted aromatic ring compound having 4 to 20 carbon atoms. In an example, $R_{15}$ may be fluorine or iodine in chemical formula Y.

The quencher may be a photo decomposable quencher (PDQ). The quencher may include a substance represented by the following chemical formula 7 and/or a substance represented by chemical formula 8.

[Chemical formula 7]

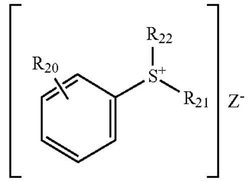

In chemical formula 7, $R_{20}$ may be hydrogen, a halogen element, a methyl group, a trifluoromethyl group, or a substituted or unsubstituted alkyl group having 1 to 5 carbon atoms, $R_{21}$ and $R_{22}$ may be independently an alkyl group having 1 to 7 carbon atoms or a substituted or unsubstituted aromatic ring compound having 4 to 20 carbon atoms, and Z may be a conjugate base of a weak acid (e.g., a carboxylic acid).

[Chemical formula 8]

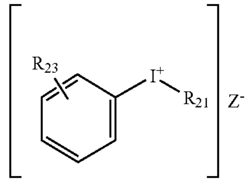

In chemical formula 8, $R_{23}$ may be hydrogen, a halogen element, a methyl group, a trifluoromethyl group or a substituted or unsubstituted alkyl group having 1 to 5 carbon atoms, $R_{24}$ may be an alkyl group having 1 to 7 carbon atoms or a substituted or unsubstituted aromatic ring compound having 4 to 20 carbon atoms, and Z may be a conjugate base of a weak acid (e.g., a carboxylic acid). In some embodiments, the quencher may include both a compound having a structure of chemical formula 7 and a compound having a structure of chemical formula 8, wherein Z of chemical formula 7 may be the same as or different from Z of chemical formula 8.

In some embodiments, the substance represented by the chemical formula 7 may include a substance represented by the following chemical formula 7A.

[Chemical formula 7A]

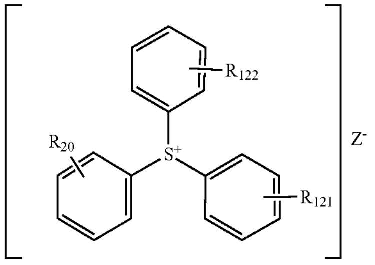

In chemical formula 7A, $R_{20}$, $R_{121}$ and $R_{122}$ are independently hydrogen, a halogen element, a methyl group a trifluoromethyl group, or a substituted or unsubstituted alkyl group having 1 to 5 carbon atoms, and Z is as defined in chemical formula 7.

In some embodiments, the substance represented by the chemical formula 8 may include a substance represented by the following chemical formula 8A.

[Chemical formula 8A]

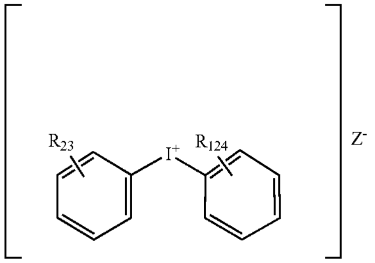

In chemical formula 8A, $R_{23}$ and $R_{124}$ are independently hydrogen, a halogen element, a methyl group, a trifluoromethyl group, or a substituted or unsubstituted alkyl groups having 1 to 5 carbon atoms, and Z is as defined in chemical formula 8.

In some embodiments, in chemical formulas 7 and 8, Z may include a carboxylate group having 1 to 10 carbon atoms. For example, Z may include a substance represented by the following chemical formula Z in chemical formulas 7 and 8.

[Chemical Formula Z]

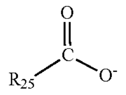

In chemical formula Z, $R_{25}$ may be hydrogen, a halogen element, a substituted or unsubstituted alkyl group having 1 to 20 carbon atoms, or a substituted or unsubstituted aromatic ring compound having 4 to 20 carbon atoms.

The photoresist composition may further include an organic solvent. In some embodiments, the organic solvent may be a non-polar solvent. For example, the organic solvent may include propylene glycol metal ether acetate (1-methoxy-2-propyl acetate, PGMEA), propylene glycol methyl ether (1-methoxy-2-propanol, PGME), Ethylene glycol (ethane-1,2-diol, EL), Gamma-butylolactone (GBA) and/or Diacetone alcohol (DAA). The polymerization unit and/or monomer including the sensitizer group may have a high solubility in the organic solvent. In some embodiments, the photoresist composition may be prepared by dissolving the polymer, the photoacid generator, and the quencher in the organic solvent.

When the polymer includes a sensitizer group according to some embodiments, the polymer may be better dissolved in the organic solvent. For example, the sensitizer group according to some embodiments has a relatively low ionization energy. Therefore, when light is irradiated, a generation rate of secondary electrons may be relatively high. Therefore, when light is irradiated, the solubility of the polymer in the organic solvent may increase.

Hereinafter, the exposure process of a photoresist composition including a polymer including a first polymerization unit represented by the chemical formula 1 and a second polymerization unit represented by the chemical formula 2 according to some embodiments will be described in more detail.

In some embodiments, during the exposure process of the photoresist film, the polymer may absorb photons of light and release electrons and hydrogen ions ($H^+$) and form a polymer of a modified structure. The light may be extreme ultraviolet (EUV). For example, the sensitizer of polymer may absorb photons of light and release electrons and hydrogen ions ($H^+$). The electron and hydrogen ion ($H^+$) emission reactions of the polymer according to some embodiments may proceed as in reaction formula 1 below.

[Reaction formula 1]

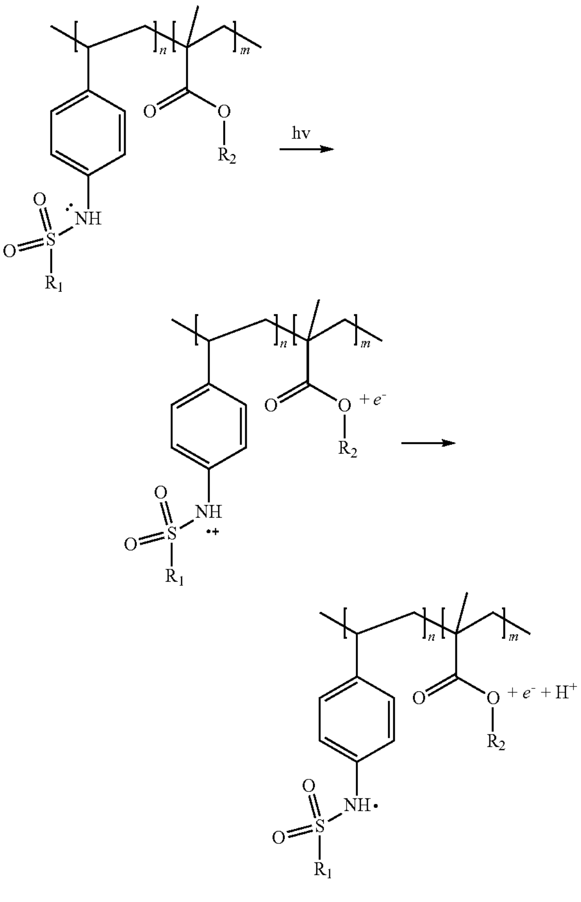

First, the sensitizer group, that is, the sensitizer group in the first polymerization unit represented by the chemical formula 1 releases electrons when irradiated with light by the reaction of the Reaction formula 1. When the sensitizer group is irradiated with light, electrons placed at the outermost part of nitrogen (N) are released.

The sensitizer group then releases hydrogen ions ($H^+$). Hydrogen ions ($H^+$) bound to the nitrogen of the sensitizer group are released. The released hydrogen ion ($H^+$) may react with a protection group, that is, the protection group in a second polymerization unit represented by the chemical formula 2. The protection group may react with the hydrogen ion ($H^+$) released by the reaction of Reaction formula 1.

For example, the ester group of the protection group may react with hydrogen ions ($H^+$) to form a carboxylic acid. The carboxylic acid formation reaction may be referred to as a deprotection reaction. The second polymerization unit on which the carboxylic acid is formed may be a polymer having a modified structure, and the exposed portion of the photoresist film may include a polymer having a modified structure. The polymer having the modified structure may be more easily dissolved in the solvent.

The photoacid generator may generate hydrogen ions ($H^+$) by photons of light. The generation of hydrogen ions ($H^+$) from the photoacid generator may proceed as in Reaction formula 2 below. Hydrogen ions ($H^+$) generated from the photoacid generator may promote the formation of modified polymers.

[Reaction formula 2]

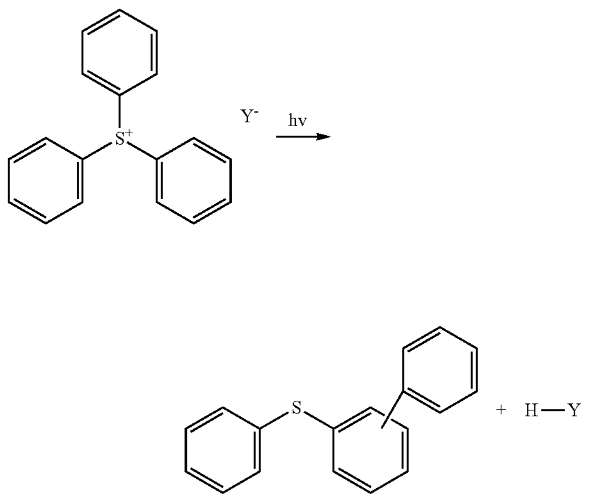

In Reaction formula 2, Y is as defined in chemical formula 5 above.

Extreme ultraviolet has high energy per photon and may have a smaller number of photons at the same amount of exposure as compared to the light of a KrF exposure process. If the sensitizer group is omitted from the polymer, the deprotection reaction efficiency of the polymer may decrease due to a small number of photons. That is, it may be difficult for the deformed polymer to be sufficiently formed in the exposed portion of the photoresist film. Due to the photon shot noise effect, the photoresist pattern may have a relatively large line width roughness.

In some embodiments, the sensitizer group may have low ionization energy. As a result, the sensitizer group may be easily activated, even with a relatively small number of photons, and may generate secondary electrons and hydrogen ions ($H^+$).

Hereinafter, the efficiency of polymer for photoresist and the photoresist composition including the same will be described referring to the test examples and comparative examples of the present disclosure.

Comparative Example 1

A polymer including polyhydroxystyrene (hereinafter PHS), which is a substance represented by the following chemical formula 1-x, a photoacid generator, a quencher, and a dye are mixed to form a photoresist composition. Among them, the ionization energy of the polymer including PHS is measured.

[Chemical formula 1-x]

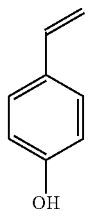

Test Example 1

A polymer including a substance represented by the following chemical formula 1-y, a photoacid generator, a quencher and a dye are mixed to form a photoresist composition. Among them, the ionization energy of the substance represented by the chemical formula 1-y is measured.

[Chemical formula 1-y]

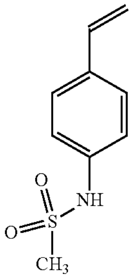

Test Example 2

A polymer including a substance represented by the chemical formula 1-z, a photoacid generator, a quencher and a dye are mixed to form a photoresist composition. Among them, the ionization energy of the substance represented by the chemical formula 1-z is measured.

[Chemical formula 1-z]

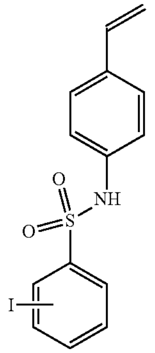

Table 1 is the results of measurement of the ionization energies of Comparative example 1, Test example 1, and Test example 2. Ionization energy refers to an energy required to extract electrons from an atom or molecule. It is interpreted as the the higher ionization energy, the more difficult it is for the particle to lose electrons.

TABLE 1

| | Type of sensitizer in composition | Ionization energy (kcal/mol) |
|---|---|---|
| Comparative example 1 | Substance represented by chemical formula 1-x | 136.9 |
| Example 1 | Substance represented by chemical formula 1-y | 134.4 |
| Example 2 | Substance represented by chemical formula 1-z | 134.8 |

Referring to Table 1, Test example 1 and Test example 2 have lower ionization energies than Comparative example 1. This may be interpreted that Test example 1 and Test example 2 are easier to lose electrons than Comparative example 1. According to embodiments, the substances represented by chemical formulas 1-y and 1-z may further increase the efficient of the process in the exposure process compared to the substance represented by chemical formula 1-x.

Hereinafter, a method for forming pattern and a method for fabricating a semiconductor device using the photoresist composition according to some embodiments will be described.

Figure 1B:
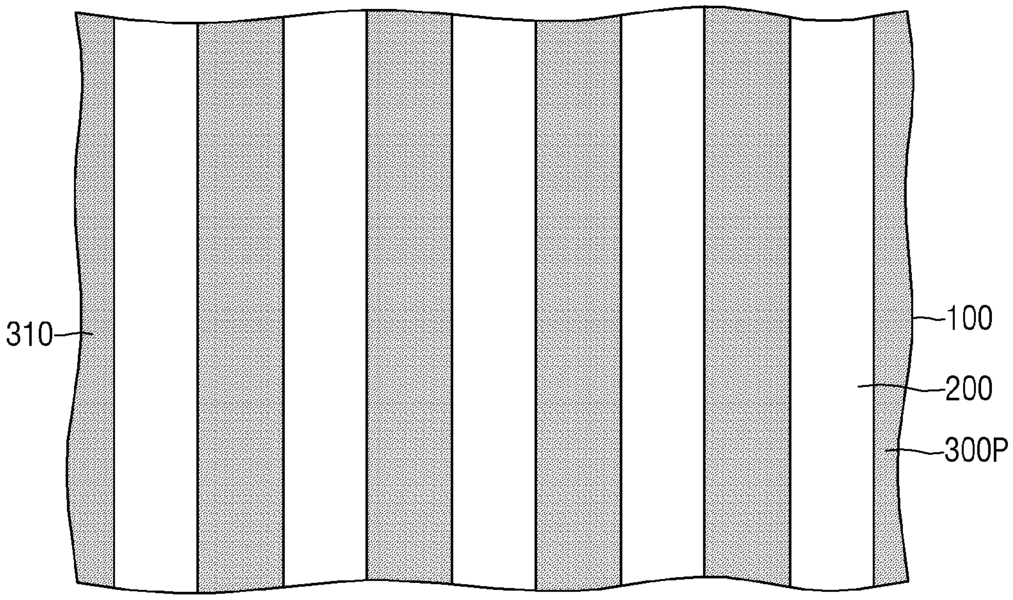

FIGS. 1A and 1B are plan views showing a photoresist pattern according to some embodiments. FIGS. 2 to 6 are diagrams for explaining a method for fabricating a semiconductor device according to some embodiments of the present invention. For reference, FIGS. 2 to 6 may be cross-sectional views taken along a A-A line of FIG. 1A.

Figure 2:
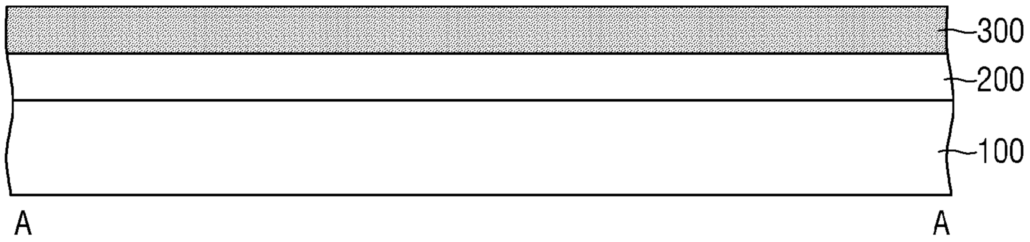
FIGS. 2 to 6 are diagrams for explaining a method for fabricating a semiconductor device according to some embodiments.

Referring to FIGS. 1A and 2, a substrate 100 may be provided. A lower film 200 and a photoresist film 300 may be sequentially formed on the substrate 100. The lower film 200 may be, for example, an etching target film. The lower film 200 may be at least one of a semiconductor substance, a conductive substance, an insulating substance, and a combination thereof. The lower film 200 may be a single film, or may be a plurality of films in which a plurality of layers are stacked. Although not shown, the substrate 100 and the lower film 200 may not be in contact with each other. Other layers may be further placed between the substrate 100 and the lower film 200.

The photoresist composition may be applied onto the lower film 200. The photoresist film 300 may be formed by applying the photoresist composition. Application of the photoresist composition may proceed by spin coating. A heat treatment process may be further performed on the applied photoresist composition. The heat treatment process may correspond to a baking process of the photoresist film 300.

Figure 3:
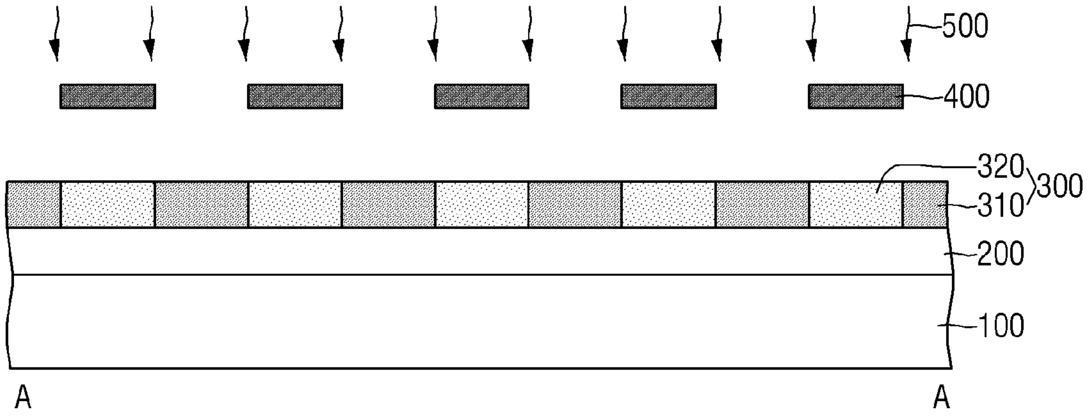

Referring to FIGS. 1A and 3, the photoresist film 300 may be exposed by light 500. The light 500 may be an electron beam or extreme ultraviolet. The photomask 400 may be placed on the photoresist film 300 before the light 500 is irradiated. The light 500 may be irradiated onto the first portion 310 of the photoresist film 300 exposed by the photomask 400.

When the photoresist film 300 is exposed to light 500, as described above, the photoresist polymer may absorb photons of light and release electrons and hydrogen ions ($H^+$). The photoresist polymer may undergo a deprotection reaction by the generated electrons or hydrogen ions ($H^+$). The photoresist polymer may form a polymer of a modified structure.

The sensitizer may generate secondary electrons and hydrogen ions ($H^+$). Since the photoresist composition includes the sensitizer, the deprotection reaction efficiency of the polymer is improved, and the polymer of the modified structure may be formed at a higher efficiency. The first portion 310 of the photoresist film 300 may be formed quickly, and the first portion 310 or the second portion 320 of the photoresist film 300 may be formed at a more improved line width roughness.

The second portion 320 of the photoresist film 300 is not exposed to the light 500. A chemical structure of the photoresist composition inside the second portion 320 of the photoresist film 300 may not change. Therefore, after the irradiation of the light 500 is completed, the substance of the first portion 310 of the photoresist film 300 may have a chemical structure different from that of the substance of the second portion 320. When secondary electrons or hydrogen ions ($H^+$) generated in the first portion 310 of the photoresist film 300 move to the second portion 320, the structure of the polymer of the second portion 320 may change.

In some embodiments, the quencher may reduce or prevent movement of the secondary electrons or hydrogen ions generated in the first portion 310 to the second portion 320. Accordingly, the first portion 310 and the second portion 320 of the photoresist film 300 may be formed at desired positions with high accuracy. After that, the photomask 400 may be removed.

Figure 4:
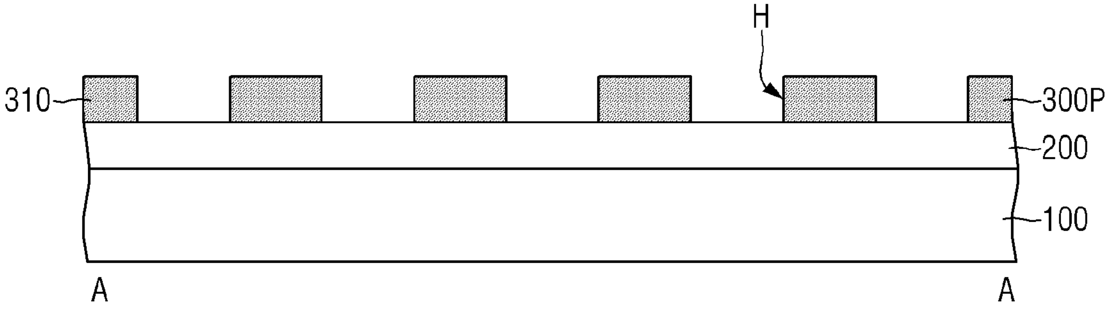

Referring to FIGS. 1A and 4, the photoresist pattern 300P may be formed by removing the second portion 320 of the photoresist film 300 with a developer. The second portion 320 of the photoresist film 300 has reactivity to the developer. The first portion 310 of the photoresist film 300 has no reactivity to the developer. Therefore, the second portion 320 of the photoresist film 300 may be selectively removed. The photoresist pattern 300P may correspond to the first portion 310 of the photoresist film 300. The photoresist pattern 300P may expose the lower film 200. Extreme ultraviolet has high energy per each photon. Therefore, the photoresist pattern 300P may be formed with a fine width and pitch. The photoresist pattern 300P may have improved line width roughness.

The photoresist pattern 300P may be formed by a patterning process including an exposure and development process of the photoresist film 300.

As shown in FIG. 1A, the photoresist pattern 300P may have a plurality of holes H. Each of the holes H may have a circular shape. The holes H of the photoresist pattern 300P may be arranged in a honeycomb shape. As yet another example, the photoresist pattern 300P may have various shapes such as a zigzag shape, a polygonal shape or a circular shape.

As shown in FIG. 1B, the photoresist pattern 300P may have a linear planar shape. For example, the photoresist pattern 300P may include a portion extending in one direction. A planar shape of the photoresist pattern 300P may be variously deformed.

Figure 5:
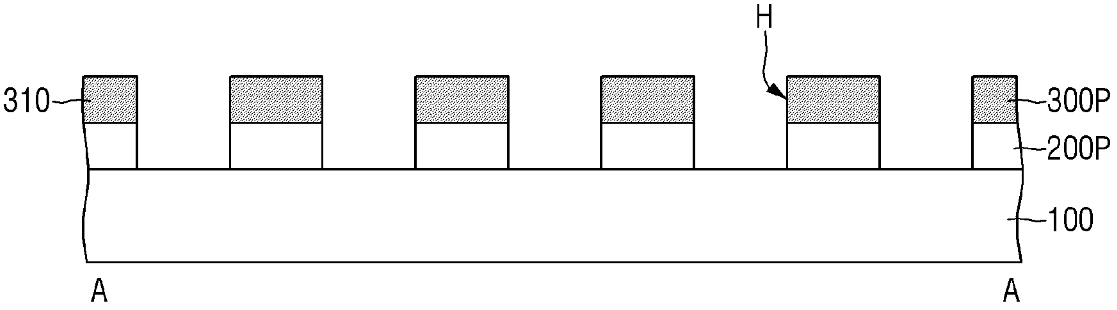

Referring to FIGS. 1A and 5, the lower film 200 exposed by the photoresist pattern 300P may be removed to form a lower pattern 200P. The lower film 200 may be removed by an etching process. The lower film 200 may have an etching selectivity with respect to the photoresist pattern 300P. The lower pattern 200P may expose the substrate 100. As another example, the lower pattern 200P may expose other layers interposed between the substrate 100 and the lower pattern 200P. The width of the lower pattern 200P may correspond to the width of the photoresist pattern 300P. Since the photoresist pattern 300P has a narrow width, the width of the lower pattern 200P may be formed to a narrow width. Since the photoresist pattern 300P has an improved line width roughness, uniformity of the width of the lower pattern 200P may be improved. Since the photoresist pattern 300P is formed at a desired position with high accuracy, the patterning accuracy of the lower pattern 200P may be improved.

Figure 6:
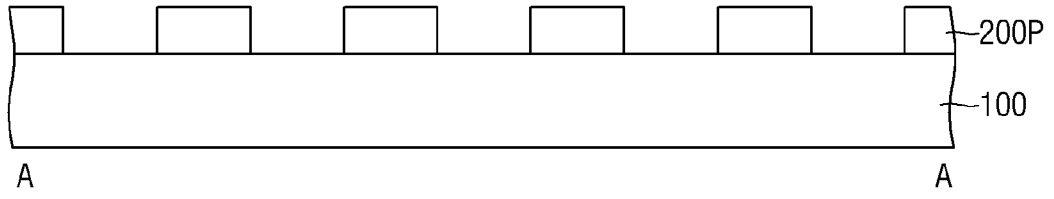

Referring to FIGS. 1A and 6, the photoresist pattern 300P may be removed. As a result, the formation of the pattern may end. In some embodiments, the lower pattern 200P may be a component of the semiconductor device. For example, the lower pattern 200P may be a semiconductor pattern, a conductive pattern or an insulating pattern inside the semiconductor device.

Figure 7:
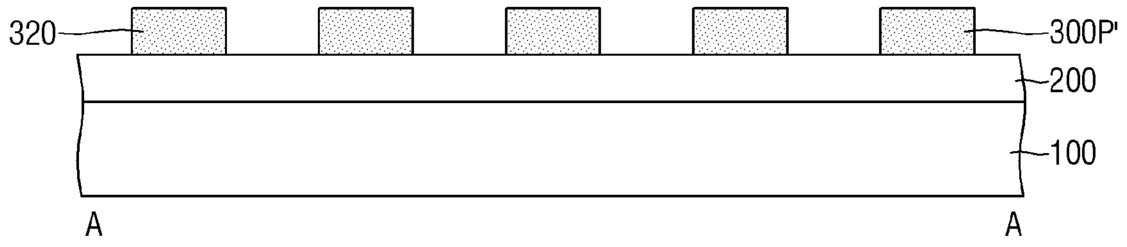
FIGS. 7 and 8 are diagrams for explaining a method for fabricating a semiconductor device according to some embodiments.
Figure 8:
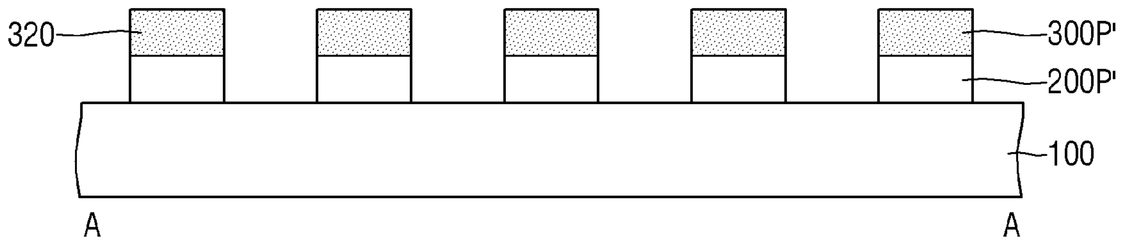

FIGS. 7 and 8 are diagrams for explaining a method for fabricating a semiconductor device according to some embodiments.

Referring to FIG. 2, the photoresist film 300 and the lower film 200 may be formed on the substrate 100.

Referring to FIG. 3, light 500 may be irradiated to the top of the first portion 310 of the photoresist film 300. After the irradiation of the light 500 is completed, the substance of the first portion 310 of the photoresist film 300 may have a chemical structure different from that of the substance of the second portion 320.

Referring to FIG. 7, a photoresist pattern 300P' may be formed by removing the first portion 310 of the photoresist film 300 with a developer. The second portion 320 of the photoresist film 300 may not be removed by the developer. The photoresist pattern 300P' may correspond to the second portion 320 of the photoresist film 300.

Referring to FIG. 8, the lower film 200 may be etched to form the lower pattern 200P'. However, the lower pattern 200P' may be formed at a position corresponding to the second portion 320 of the photoresist pattern 300P'. Etching of the lower film 200 may be performed by substantially the same process as that of description of FIG. 5. After that, the photoresist pattern 300P' may be removed.

In concluding the detailed description, those skilled in the art will appreciate that many variations and modifications may be made to the example embodiments described herein without substantially departing from the scope of the present invention. Therefore, the example embodiments of the disclosure are used in a generic and descriptive sense only and not for purposes of limitation.

What is claimed is:

1. A polymer for photoresist, the polymer comprising:

a first polymerization unit comprising a sensitizer group; and a protection group, wherein the first polymerization unit comprises a structure of chemical formula 1:

[Chemical formula 1]

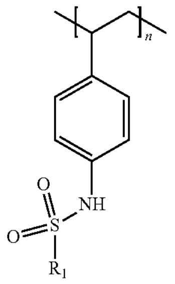

wherein $R_1$ is hydrogen, a halogen element, a methyl group, a trifluoromethyl group, a substituted or unsubstituted alkyl group having 1 to 10 carbon atoms, a substituted or unsubstituted aryl group having 6 to 18 carbon atoms, or a substituted or unsubstituted arylalkyl group having 6 to 18 carbon atoms, and n is an integer of 1 to 100,000;

and wherein the first polymerization unit further comprises at least one of a unit of chemical formula 3 and a unit of chemcial formula 4:

[Chemical formula 3]

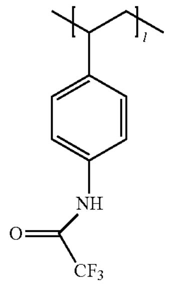

1 is an integer of 1 to 100,000, and

[Chemical formula 4]

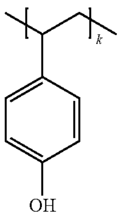

k is an integer of 1 to 100,000.

2. The polymer for photoresist of claim 1, wherein the protection group is present in a second polymerization unit that comprises a structure of chemical formula 2:

[Chemical formula 2]

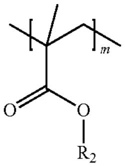

wherein $R_2$ is a substituted or unsubstituted alkyl group having 4 to 15 carbon atoms, or an aromatic ring compound, and m is an integer from 1 to 100,000.

3. The polymer for photoresist of claim 2, wherein a ratio of n to m is 3:7 to 5:5.

4. The polymer for photoresist of claim 3, wherein the ratio of n tom is 4:6.

5. The polymer for photoresist of claim 2, wherein the protection group reacts with an acid or a base.

6. The polymer for photoresist of claim 2, wherein the second polymerization unit is formed with at least one monomer having a structure of one the following chemical formulas:

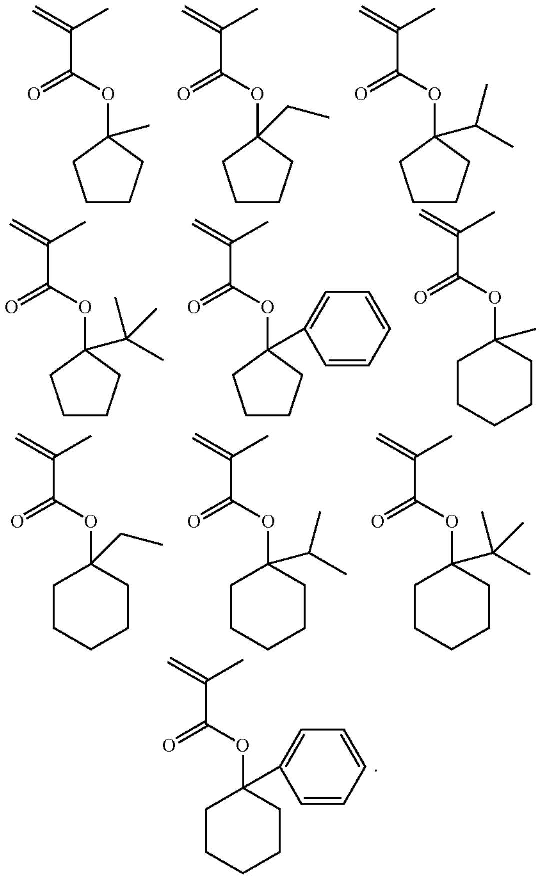

7. The polymer for photoresist of claim 1, wherein the sensitizer group does not react with an acid or a base.

8. A photoresist composition comprising:

a polymer comprising a first polymerization unit that comprises a sensitizer group; and a photoacid generator, wherein the first polymerization unit comprises a structure of chemical formula 1:

[Chemical formula 1]

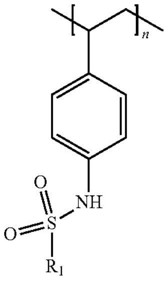

wherein $R_1$ is hydrogen, a halogen element, a methyl group, a trifluoromethyl group, a substituted or unsubstituted alkyl group having 1 to 10 carbon atoms, a substituted or unsubstituted aryl group having 6 to 18 carbon atoms, or a substituted or unsubstituted arylalkyl group having 6 to 18 carbon atoms, and n is an integer of 1 to 100,000; and wherein the first polymerization unit further comprises at least one of a unit of chemical formula 3 and a unit of chemical formula 4:

[Chemical formula 3]

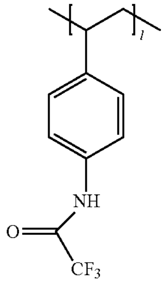

1 is an integer of 1 to 100,000, and

[Chemical formula 4]

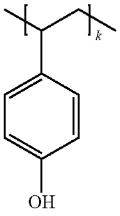

k is an integer of 1 to 100,000.

9. The photoresist composition of claim 8, wherein the sensitizer group does not react with an acid or a base.

10. The photoresist composition of claim 8, wherein the photoacid generator comprises at least one of a compound having a structure of chemical formula 5 and a compound having a structure of chemical formula 6:

[Chemical formula 5]

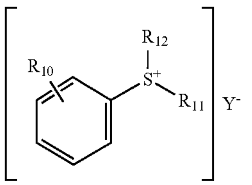

wherein $R_{10}$ is hydrogen, a halogen element, a methyl group, a trifluoromethyl group, or a substituted or unsubstituted alkyl group having 1 to 5 carbon atoms, $R_{11}$ and $R_{12}$ are independently an alkyl group having 1 to 7 carbon atoms or a substituted or unsubstituted aromatic ring compound having 4 to 20 carbon atoms, and $Y_1$ is a sulfonate group having 1 to 20 carbon atoms, and

[Chemical formula 6]

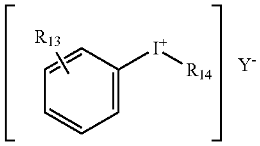

wherein $R_{13}$ is hydrogen, a halogen element, a methyl group, a trifluoromethyl group, or a substituted or unsubstituted alkyl group having 1 to 5 carbon atoms, $R_{14}$ is an alkyl group having 1 to 7 carbon atoms or a substituted or unsubstituted aromatic ring compound having 4 to 20 carbon atoms, and $Y_2$ is a sulfonate group having 1 to 20 carbon atoms.

11. A photoresist composition comprising:

a polymer comprising a sensitizer group and a protection group;

a photoacid generator; and a quencher, wherein a first polymerization unit having a structure of chemical formula 1 comprises the sensitizer group, and a second polymerization unit having a structure of chemical formula 2 comprises the protection group:

[Chemical formula 1]

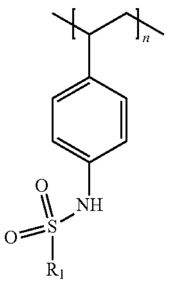

wherein $R_1$ is hydrogen, a halogen element, a methyl group, a trifluoromethyl group, a substituted or unsubstituted alkyl group having 1 to 10 carbon atoms, a substituted or unsubstituted aryl group having 6 to 18 carbon atoms, or a substituted or unsubstituted arylalkyl group having 6 to 18 carbon atoms, and n is an integer of 1 to 100,000,

[Chemical formula 2]

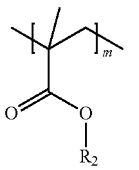

wherein $R_2$ is a substituted or unsubstituted alkyl group having 4 to 15 carbon atoms, or an aromatic ring compound, m is an integer of 1 to 100,000, and n:m is 3:7 to 5:5; and wherein the first polymerization unit further comprises at least one of a unit having a structure of chemical formula 3 and a unit having a structure of chemical formula 4:

[Chemical formula 3]

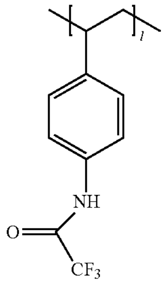

wherein 1 is an integer of 1 to 100,000,

[Chemical formula 4]

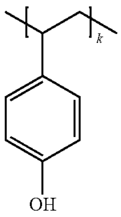

wherein k is an integer of 1 to 100,000.

12. The photoresist composition of claim 11, wherein the photoacid generator comprises at least one of a compound having a structure of chemical formula 5 and a compound having a structure of chemical formula 6:

[Chemical formula 5]

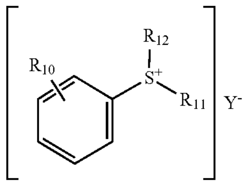

wherein $R_{10}$ is hydrogen, a halogen element, a methyl group, a trifluoromethyl group, or a substituted or unsubstituted alkyl group having 1 to 5 carbon atoms, $R_{11}$ and $R_{12}$ are independently an alkyl group having 1 to 7 carbon atoms or a substituted or unsubstituted aromatic ring compound having 4 to 20 carbon atoms, and $Y_1$ is a sulfonate group having 1 to 20 carbon atoms, and

[Chemical formula 6]

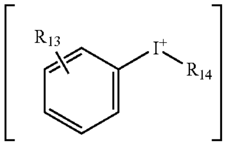

wherein $R_{13}$ is hydrogen, a halogen element, a methyl group, a trifluoromethyl group, or a substituted or unsubstituted alkyl group having 1 to 5 carbon atoms, $R_{14}$ is an alkyl group having 1 to 7 carbon atoms or a substituted or unsubstituted aromatic ring compound having 4 to 20 carbon atoms, and $Y_2$ is a sulfonate group having 1 to 20 carbon atoms.

13. The photoresist composition of claim 11, wherein the quencher comprises at least one of a compound having a structure of chemical formula 7 and a compound having a structure of chemical formula 8:

[Chemical formula 7]

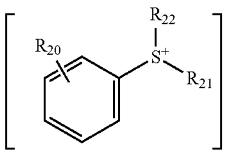

wherein $R_{20}$ is hydrogen, a halogen element, a methyl group, a trifluoromethyl group, or a substituted or unsubstituted alkyl group having 1 to 5 carbon atoms, $R_{21}$ and $R_{22}$ are independently an alkyl group having 1 to 7 carbon atoms or a substituted or unsubstituted aromatic ring compound having 4 to 20 carbon atoms, and $Z_1$ is a carboxylate group having 1 to 10 carbon atoms, and

[Chemical formula 8]

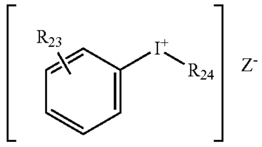

wherein $R_{23}$ is hydrogen, a halogen element, a methyl group, a trifluoromethyl group, or a substituted or unsubstituted alkyl group having 1 to 5 carbon atoms, $R_{24}$ is an alkyl group having 1 to 7 carbon atoms or a substituted or unsubstituted aromatic ring compound having 4 to 20 carbon atoms, and $Z_2$ is a carboxylate group having 1 to 10 carbon atoms.

14. The photoresist composition of claim 11, wherein the sensitizer group does not react with an acid or a base, and the protection group reacts with the acid or the base.

15. The photoresist composition of claim 8, wherein the polymer further comprises a second polymerization unit that comprises a protection group, and the second polymerization unit comprises a structure of chemical formula 2:

[Chemical formula 2]

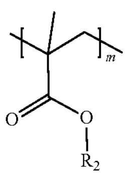

wherein $R_2$ is a substituted or unsubstituted alkyl group having 4 to 15 carbon atoms, or an aromatic ring compound, and m is an integer from 1 to 100,000.

16. The photoresist composition of claim 15, wherein a ratio of n to m is 3:7 to 5:5.

* * * * *